(12) United States Patent
Teng

(10) Patent No.: US 11,929,275 B2
(45) Date of Patent: Mar. 12, 2024

(54) SEMICONDUCTOR WAFER CASSETTE ROLLER TYPE TRANSPORTATION STRUCTURE SYSTEM

(71) Applicant: Eddie and Sons Technology Co., Ltd, Hsinchu County (TW)

(72) Inventor: James Teng, Hsinchu County (TW)

(73) Assignee: EDDIE AND SONS TECHNOLOGY CO., LTD, Hsinchu County (TW)

(*) Notice: Subject to any disclaimer, the term of this patent is extended or adjusted under 35 U.S.C. 154(b) by 279 days.

(21) Appl. No.: 17/411,825

(22) Filed: Aug. 25, 2021

(65) Prior Publication Data

US 2022/0277978 A1 Sep. 1, 2022

(30) Foreign Application Priority Data

Feb. 28, 2021 (TW) .................................. 110107197

(51) Int. Cl.
*H01L 21/677* (2006.01)
*H01L 21/687* (2006.01)
*H01L 21/673* (2006.01)

(52) U.S. Cl.
CPC .. *H01L 21/67706* (2013.01); *H01L 21/67742* (2013.01); *H01L 21/68764* (2013.01); *H01L 21/67303* (2013.01)

(58) Field of Classification Search
CPC ........ B65G 13/00; B65G 13/02; B65G 13/11; B65G 13/06; H01L 21/67706; H01L 21/67742; H01L 21/68764; H01L 21/67303; H01L 21/6773
See application file for complete search history.

(56) References Cited

U.S. PATENT DOCUMENTS

| | | | |
|---|---|---|---|
| 6,779,650 B2 * | 8/2004 | Takasan | B65G 27/00 73/570.5 |
| 7,472,788 B2 * | 1/2009 | Bonora | H01L 21/6773 198/817 |
| 10,600,754 B2 * | 3/2020 | Yoshino | H01L 24/75 |

(Continued)

FOREIGN PATENT DOCUMENTS

| | | | |
|---|---|---|---|
| TW | I638760 B | 10/2018 | |
| WO | WO-2018029881 A1 * | 2/2018 | H01L 21/52 |

*Primary Examiner* — Lynn E Schwenning
(74) *Attorney, Agent, or Firm* — Muncy, Geissler, Olds & Lowe, P.C.

(57) ABSTRACT

A semiconductor wafer cassette roller type transportation structure system includes a roller type transportation structure body, a rotating transportation structure body, and a lateral movement transportation structure body. The roller type transportation structure system includes connected left and right supporting frames. A plurality of large rollers are provided on an inner surface end of each of the right and left supporting frames. A plurality of small rollers are provided under the large rollers. A plurality of driving wheels are provided under the large rollers. The large and small rollers are driven by a driving belt. The driving wheels can linearly move a wafer cassette. In response to the roller type transportation structure body transporting the wafer cassette, the rotating transportation structure body rotates to change a movement direction of the wafer cassette, and the lateral movement transportation structure body transports the wafer cassette along a lateral movement direction.

4 Claims, 24 Drawing Sheets

(56) References Cited

U.S. PATENT DOCUMENTS

2002/0108842 A1* 8/2002 Bonora .................. B65G 13/04
  198/836.1
2016/0336209 A1* 11/2016 Yoshioka .......... H01L 21/67736

* cited by examiner

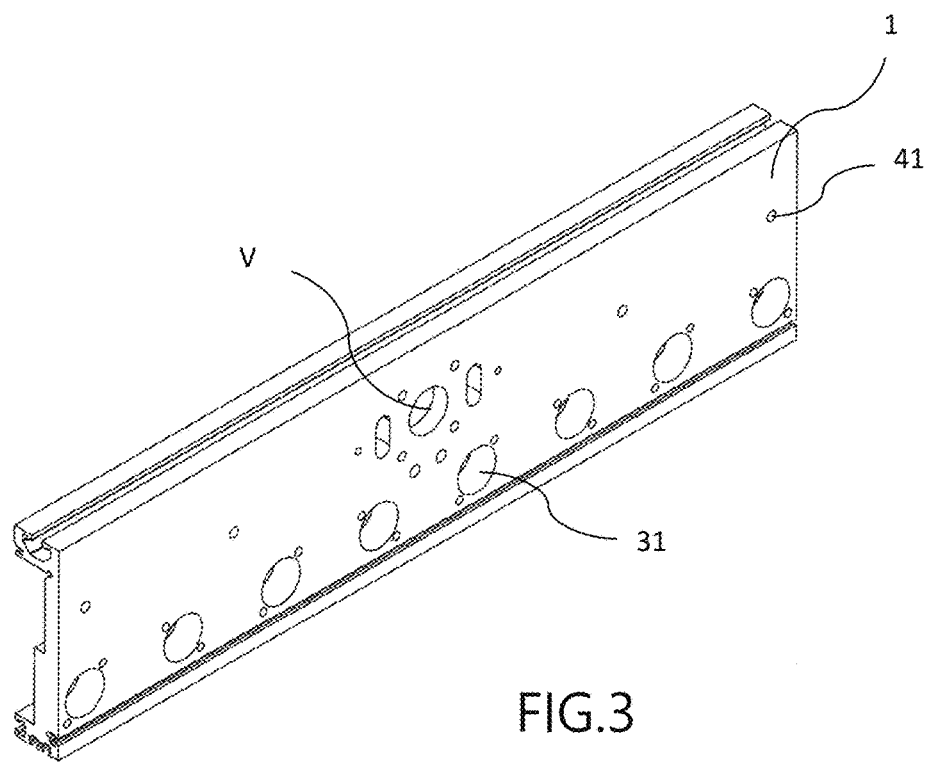
FIG.3
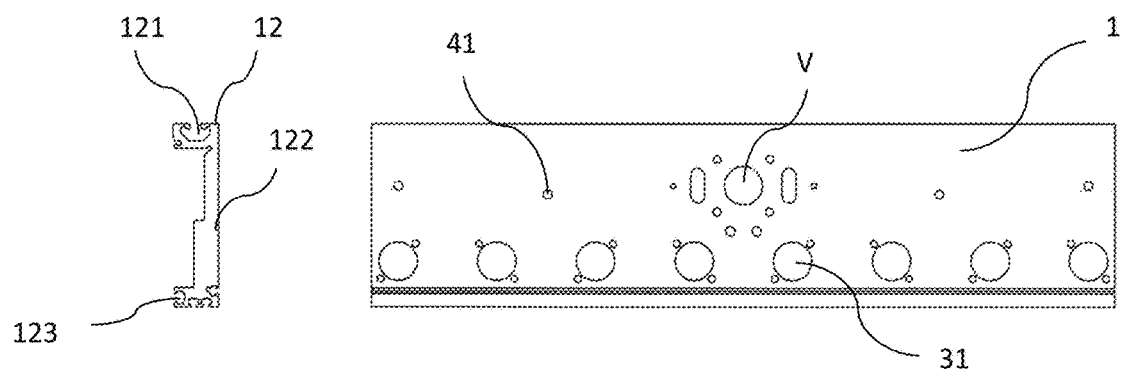
FIG.4
FIG.5

A-A

SEMICONDUCTOR WAFER CASSETTE ROLLER TYPE TRANSPORTATION STRUCTURE SYSTEM

BACKGROUND OF THE INVENTION

1. Field of the Invention

The invention relates to a semiconductor wafer cassette roller type transportation structure system comprising a roller type transportation structure body, a rotating transportation structure body and a lateral movement transportation structure body for conveniently and quickly transporting a semiconductor wafer cassette.

2. Description of Related Art

Taiwan patent number I638760, entitled "semiconductor wafer transportation carrier", comprising a carrier device 10 having a space, a detection area connected to the space, a suspension device 20 in the space for moving a wafer cassette to the space, and a detection device 30 provided on the carrier device 10. The patent discloses that the wafer cassette is move by the suspension device 20 and thus is different from the invention. While the conventional suspension type transportation system achieves the use purpose of semiconductor equipment, it does not satisfy various needs. Thus, the need for improvement of suspension type transportation system still exists.

In view of the above, the present inventor has worked deeply on the issues and aggressively searched for a solution based on years' experience in the related field, and through endeavor of repeated study and trial, eventually successfully develops a semiconductor wafer cassette roller type transportation structure system having patentable characteristics in order to overcome the drawbacks of the conventional art.

SUMMARY OF THE INVENTION

It is therefore one object of the invention to provide a semiconductor wafer cassette roller type transportation structure system, comprising a roller type transportation structure body, a rotating transportation structure body, and a lateral movement transportation structure body wherein the roller type transportation structure body includes a left supporting frame, a right supporting frame, a plurality of large rollers, a plurality of small rollers, an elongated cover, a driving rod, and a driving belt; the supporting frame is shaped as a U and includes a top U-shaped groove, a bottom U-shaped groove, an interconnection surface interconnecting the top U-shaped groove and the bottom U-shaped groove, a plurality of first apertures provided on the interconnection surface with the large rollers provided therein respectively, a plurality of second apertures provided on the interconnection surface with the small rollers provided therein respectively, and a hole provided through the interconnection surface; a driving wheel of the driving rod passes through the hole; the large roller includes a hollow first main body, a screw inserted into the first main body, a plurality of first bearings, a first roller, and a connecting rod driven through the first bearings and the first roller to be fastened by the screw in the first main body; and the small roller includes a hollow second main body, a second bearing, a second roller, and a screw driven through the second main body and the second bearing to be fastened in the second roller; the elongated cover includes two screw holes at either end; further comprising an activation rod including a driving motor, a motor shaft driven by driving motor, a bearing member put on an open end of the motor shaft; and a driving belt for rotating the large rollers, the small rollers, and the driving wheel; wherein the roller type transportation structure body includes a roller transportation structure and a rotating seat; the roller transportation structure includes a first outer covering member at a left side of the left supporting frame, a first large roller at an upper portion of the left supporting frame, a driving motor at a lower portion of the left supporting frame, a motor shaft extending out of the driving motor to connect to the right supporting frame, a second outer covering member at a right side of the right supporting frame, a second large roller at an upper portion of the right supporting frame, and a plurality of connecting rods provided between the left supporting frame and the right supporting frame; the rotating transportation structure body includes a rotating seat and a rotating motor both provided under the roller transportation structure; the lateral movement transportation structure body includes a lateral movement structure, a roller transportation structure, and a driving link in the lateral movement structure for laterally moving the wafer cassette in cooperation with the roller transportation structure.

The semiconductor wafer cassette roller type transportation structure system of the invention has the following advantages and benefits in comparison with the conventional art: the driving belt is made of dustproof, wear-resistant belt. No dust is generated when the driving belt moves along the rollers. Thus, quality of the transported wafer cassette is maintained. The rotating transportation structure body includes a rotating seat and a rotating motor both provided under the roller transportation structure. In response to the roller type transportation structure body linearly transporting the wafer cassette, the rotating transportation structure body rotates to change a movement direction of the wafer cassette, and the lateral movement transportation structure body transports the wafer cassette along a lateral movement direction. The semiconductor wafer cassette roller type transportation structure system of the invention can conveniently and quickly transport the wafer cassette.

The above and other objects, features and advantages of the invention will become apparent from the following detailed description taken with the accompanying drawings.

BRIEF DESCRIPTION OF THE DRAWINGS

FIG. 3 is a perspective view of the left supporting frame of the semiconductor wafer cassette roller type transportation structure system of the invention;

FIG. 4 is a side elevation of the left supporting frame of the semiconductor wafer cassette roller type transportation structure system of the invention;

FIG. 5 is a front view of the left supporting frame of the semiconductor wafer cassette roller type transportation structure system of the invention;

DETAILED DESCRIPTION OF THE INVENTION

Figure 1:
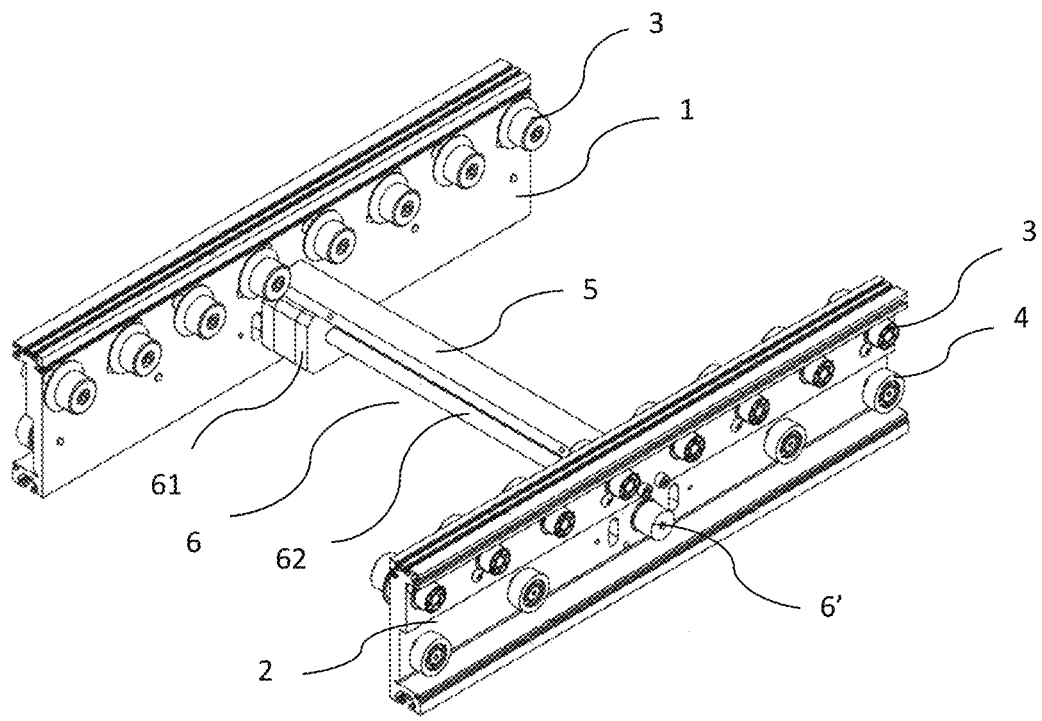
FIG. 1 is a perspective view of a roller type transportation structure body of a semiconductor wafer cassette roller type transportation structure system according to the invention.
Figure 2:
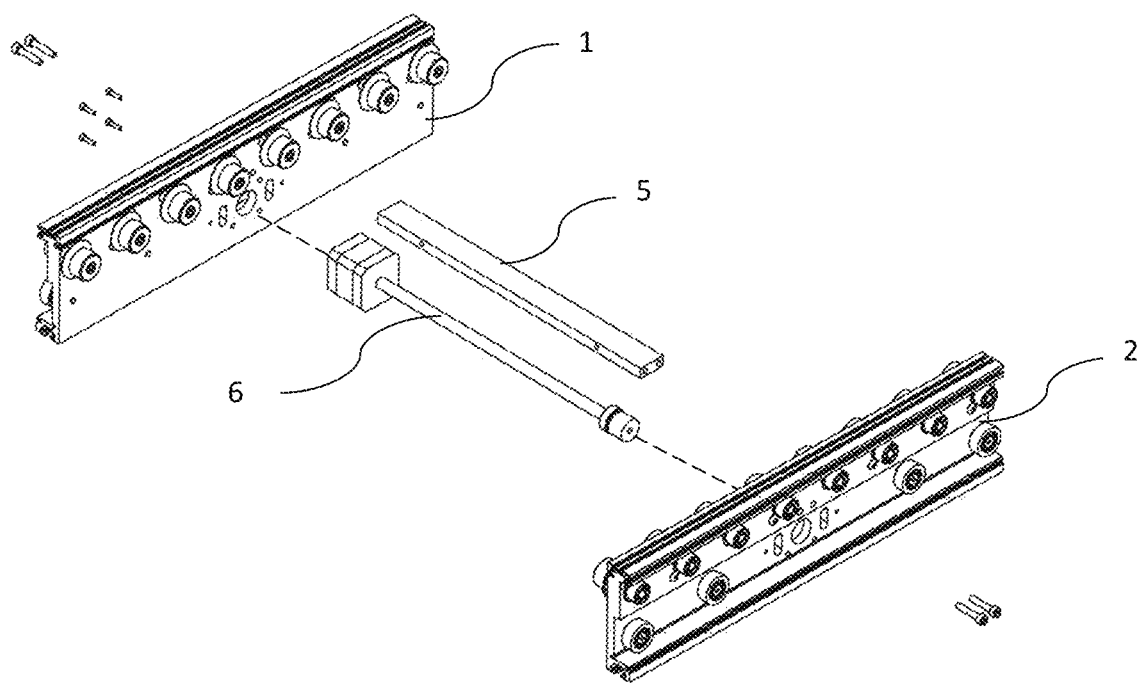
FIG. 2 is an exploded view of the roller type transportation structure body of the semiconductor wafer cassette roller type transportation structure system of the invention.

Referring to FIGS. 1 to 46, a semiconductor wafer cassette roller type transportation structure system in accordance with the invention is shown.

As shown in FIGS. 1 to 2 and 10 to 11 specifically, the semiconductor wafer cassette roller type transportation structure system comprises a roller type transportation structure body A, a rotating transportation structure body B and a lateral movement transportation structure body C as discussed in detail below. The roller type transportation structure body A includes a left supporting frame 1, a right supporting frame 2, a plurality of large rollers 3, a plurality of small rollers 4, an elongated cover 5, a driving rod 62 and a driving belt E.

As shown in FIGS. 3 to 5 specifically, the supporting frame 1 is shaped as a U and includes a top U-shaped groove 121, a bottom U-shaped groove 123, and an interconnection surface 122 interconnecting the top U-shaped groove 121 and the bottom U-shaped groove 123. A plurality of first apertures 31 are provided on the interconnection surface 122. The large rollers 3 are provided in the first apertures 31 respectively. A plurality of second apertures 41 are provided on the interconnection surface 122. The small rollers 4 are provided in the second apertures 41 respectively. A hole V is provided through the interconnection surface 122 and a driving wheel 6' of the driving rod 62 passes through the hole V.

Figure 6:
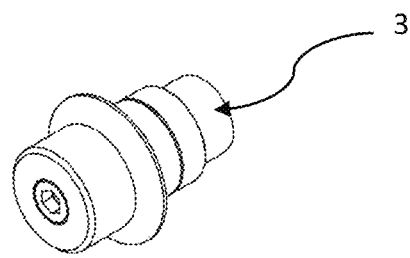
FIG. 6 is a perspective view of the large roller of the semiconductor wafer cassette roller type transportation structure system of the invention.
Figure 7:
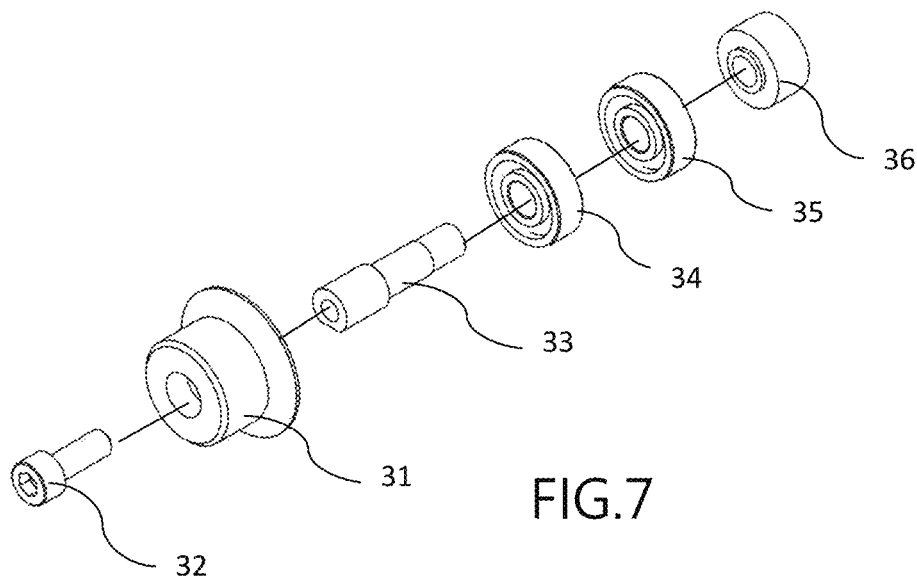
FIG. 7 is an exploded view of the large roller of the semiconductor wafer cassette roller type transportation structure system of the invention.

As shown in FIGS. 6 to 7 specifically, the large roller 3 includes a hollow main body 31, a screw 32 inserted into the main body 31, two bearings 34 and 35, a roller 36 and a connecting rod 33 driven through the bearings 34 and 35 and the roller 36 to be fastened by the screw 32 in the main body 31.

Figure 8:
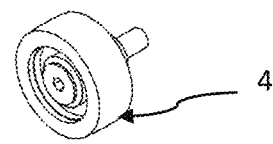
FIG. 8 is perspective view of the small roller of the semiconductor wafer cassette roller type transportation structure system of the invention.
Figure 9:
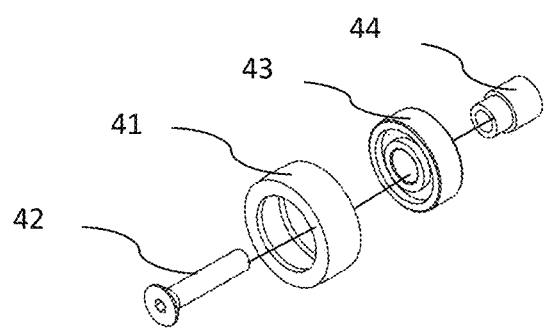
FIG. 9 is an exploded view of the small roller of the semiconductor wafer cassette roller type transportation structure system of the invention.
Figure 10:
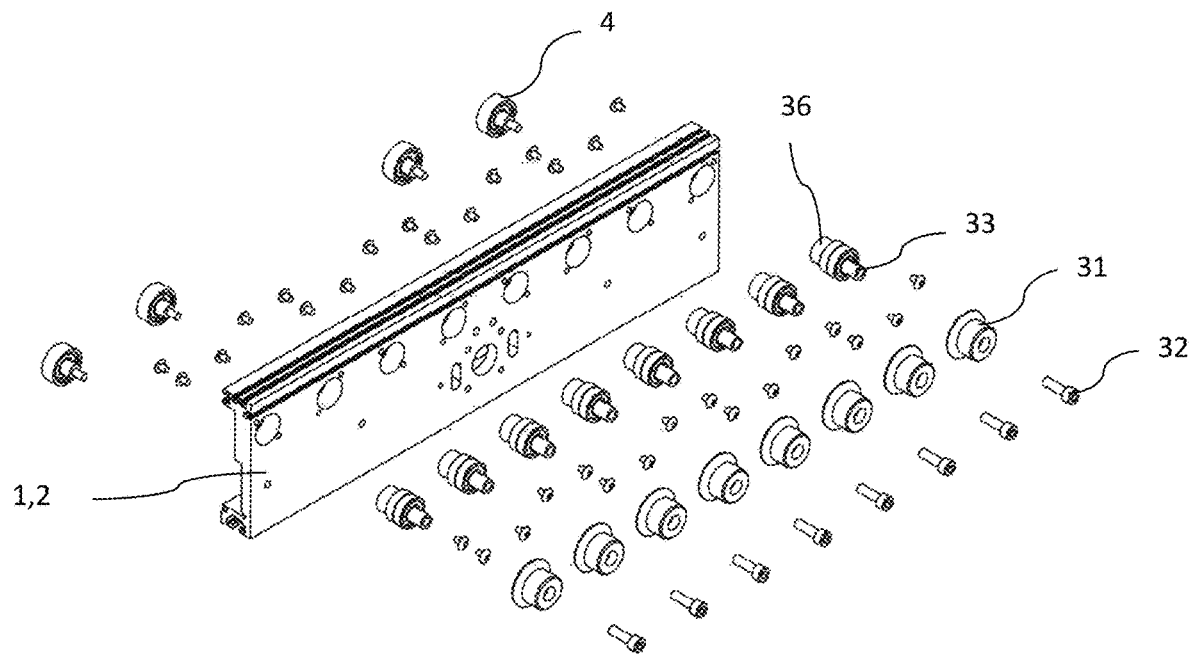
FIG. 10 is an exploded view of the semiconductor wafer cassette roller type transportation structure system of the invention.
Figure 11:
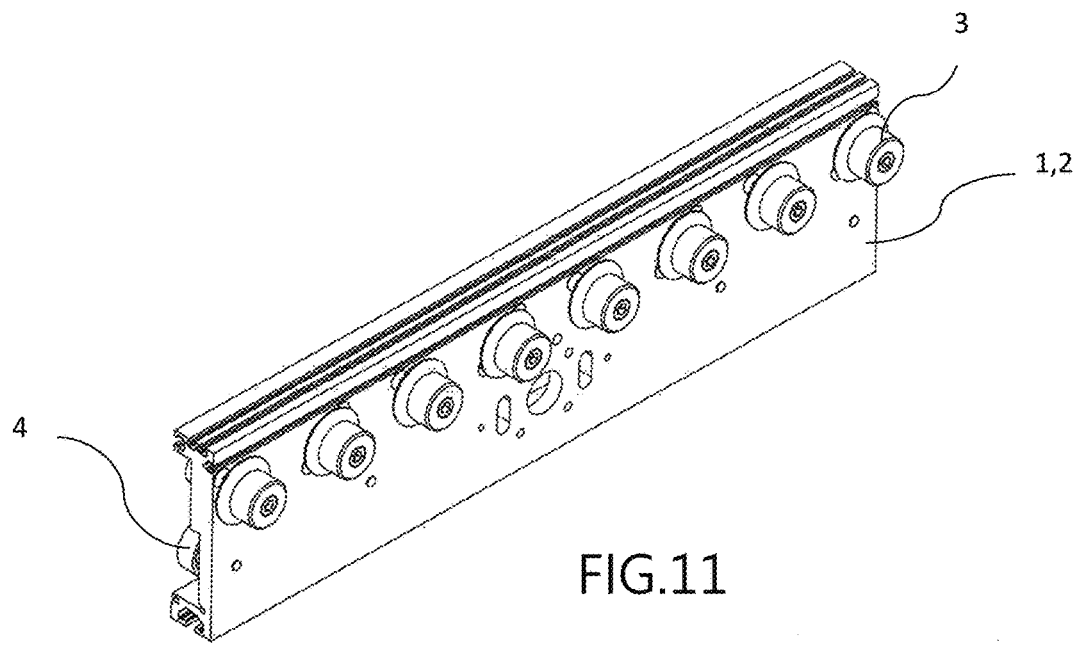
FIG. 11 is a perspective view of the semiconductor wafer cassette roller type transportation structure system of the invention.

As shown in FIGS. 8 to 9 specifically, the small roller 4 includes a hollow main body 41, a bearing 43, a roller 44 and a screw 42 driven through the main body 41 and the bearing 43 to be fastened in the roller 44.

Figures 12, 13, 14:
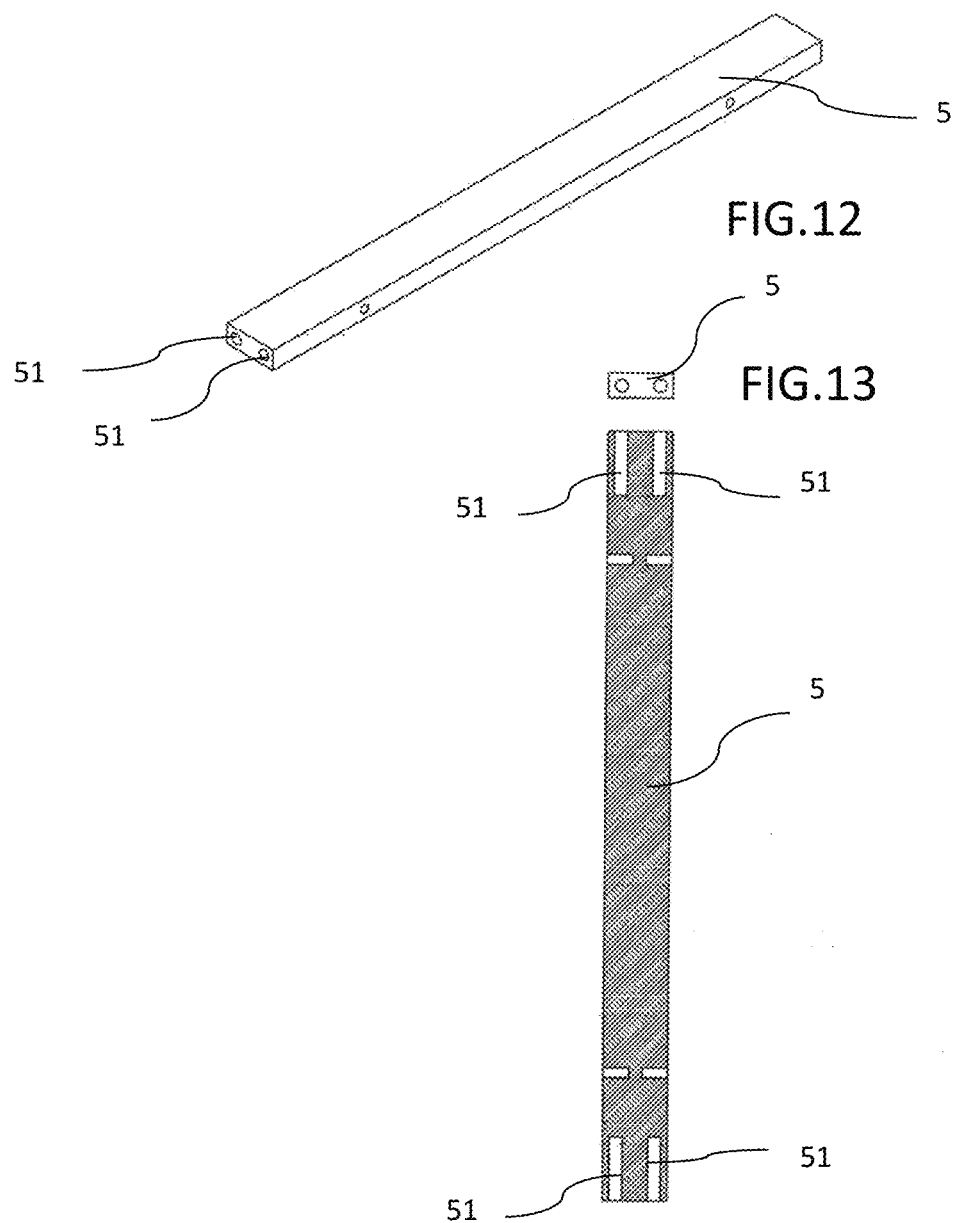
FIG. 12 is a perspective view of the cover of the semiconductor wafer cassette roller type transportation structure system of the invention.
FIG. 13 is a side elevation of the cover of the semiconductor wafer cassette roller type transportation structure system of the invention.
FIG. 14 is a longitudinal sectional view of the cover of the semiconductor wafer cassette roller type transportation structure system of the invention.

As shown in FIGS. 12 to 14 specifically, the elongated cover 5 includes two screw holes 51 at either end.

Figure 15:
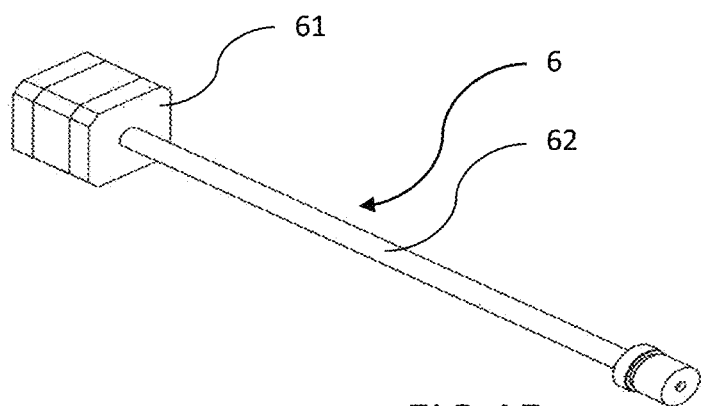
FIG. 15 is a perspective view of the driving motor, the activation rod and the motor shaft of the semiconductor wafer cassette roller type transportation structure system of the invention.
Figure 16:
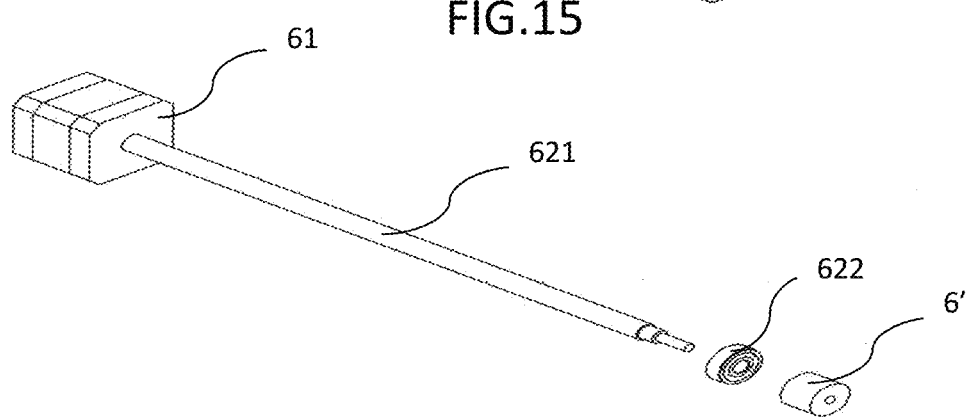
FIG. 16 is a perspective, exploded view of the driving motor, the activation rod and the motor shaft of the semiconductor wafer cassette roller type transportation structure system of the invention.

As shown in FIGS. 15 to 16 specifically, an activation rod 6 includes a motor shaft 621 driven by a driving motor 61, a bearing 622 put on an open end of the motor shaft 621, and a driving wheel 6' also provided on the open end of the motor shaft 621.

Figure 17:
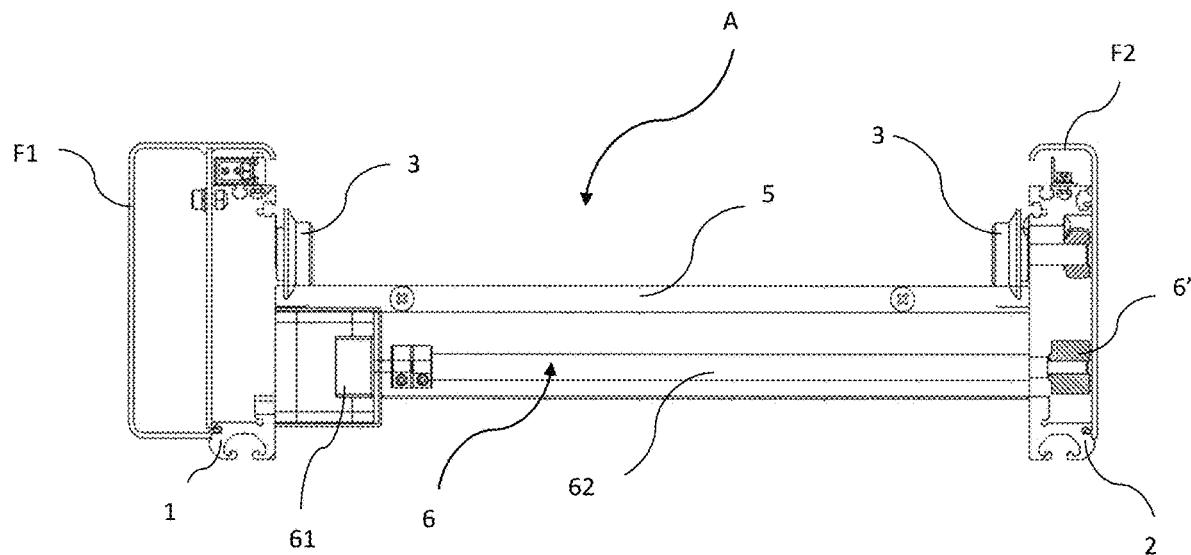
FIG. 17 is front view of the roller type transportation structure body of the semiconductor wafer cassette roller type transportation structure system of the invention.

As shown in FIG. 17 specifically, it is a front view of the roller type transportation structure body A of the semiconductor wafer cassette roller type transportation structure system of the invention. The large roller 3 is provided on an upper portion of the right side of an outer covering member F1 which is provided on the left side of the left supporting frame 1. The driving motor 61 is provided under the large roller 3 and the motor shaft 62 extending to connect to the right supporting frame 2. An outer covering element F2 is provided on the right side of the right supporting frame 2. The large roller 3 is provided on an upper portion of the left side of the right supporting frame 2. The cover 5 is provided above the activation rod 6 which interconnects the left supporting frame 1 and the right supporting frame 2.

Figure 18:
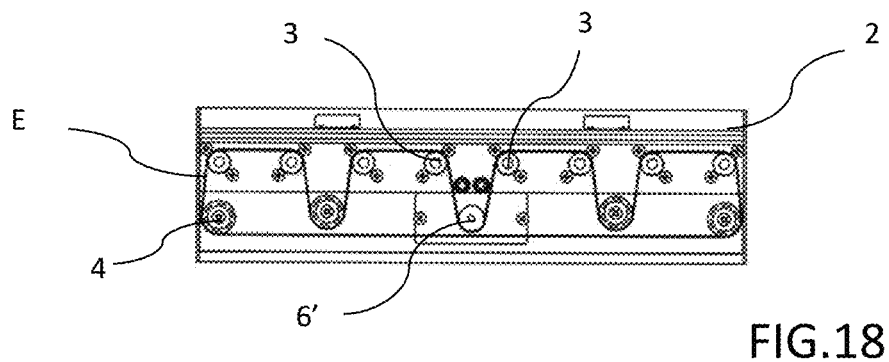
FIG. 18 is a right side elevation of the roller type transportation structure body of the semiconductor wafer cassette roller type transportation structure system of the invention showing the connection of the activation rod and the rollers.
Figure 19:
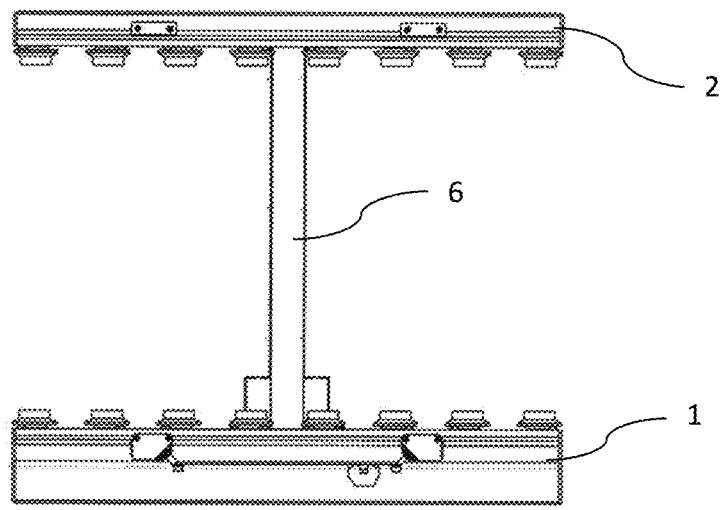
FIG. 19 is a top view of the roller type transportation structure body of the semiconductor wafer cassette roller type transportation structure system of the invention driven by the activation rod in cooperation with the rollers.
Figure 20:
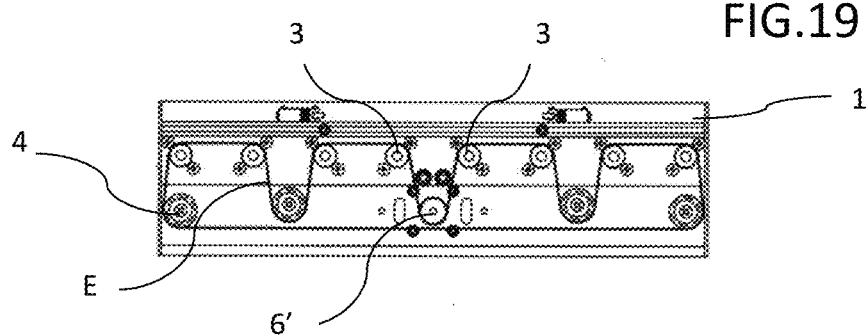
FIG. 20 is a left side elevation of the roller type transportation structure body of the semiconductor wafer cassette roller type transportation structure system of the invention showing the connection of the activation rod and the rollers.

As shown in FIGS. 18 to 20 specifically, the roller type transportation structure body of the semiconductor wafer cassette roller type transportation structure system of the invention driven by the activation rod 6 in cooperation with the small rollers 4 and the large rollers 3 is shown in a right side elevation, a top view and a left side elevation respectively. The activation rod 6 is provided between the left supporting frame 1 and the right supporting frame 2. The large rollers 3 are provided on an inner surface of each of the left supporting frame 1 and the right supporting frame 2. A driving wheel 6' is provided under the large rollers 3. The small rollers 4 are provided on either side of the driving wheel 6'. A driving belt E is used to rotate the large rollers 3 and the small rollers 4. A wafer cassette S is placed on the roller type transportation structure body A to be transported.

Figure 21:
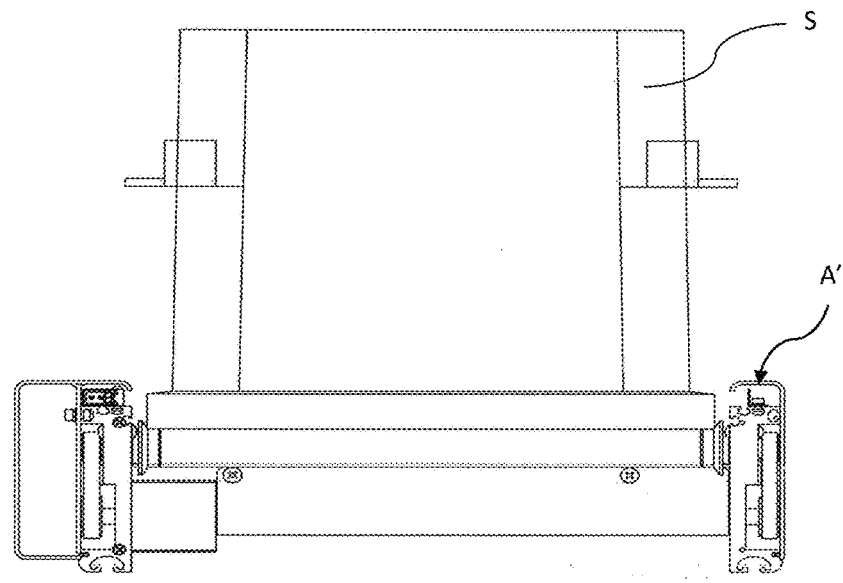
FIG. 21 schematically depicts the roller type transportation structure body of the semiconductor wafer cassette roller type transportation structure system of the invention transporting a wafer cassette.

As shown in FIG. 21 specifically, it schematically depicts the roller type transportation structure body A' of the semiconductor wafer cassette roller type transportation structure system of the invention transporting a wafer cassette 5.

Figure 22:
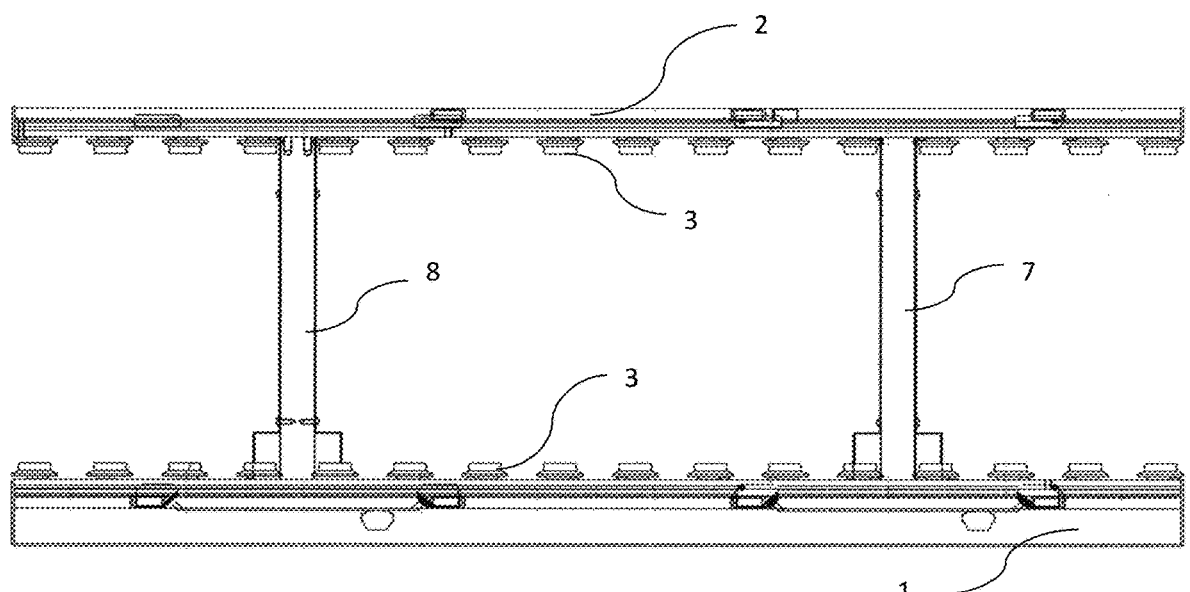
FIG. 22 is a top view of the roller type transportation structure body of the semiconductor wafer cassette roller type transportation structure system of the invention driven by two activation rods in cooperation with the rollers.
Figure 23:
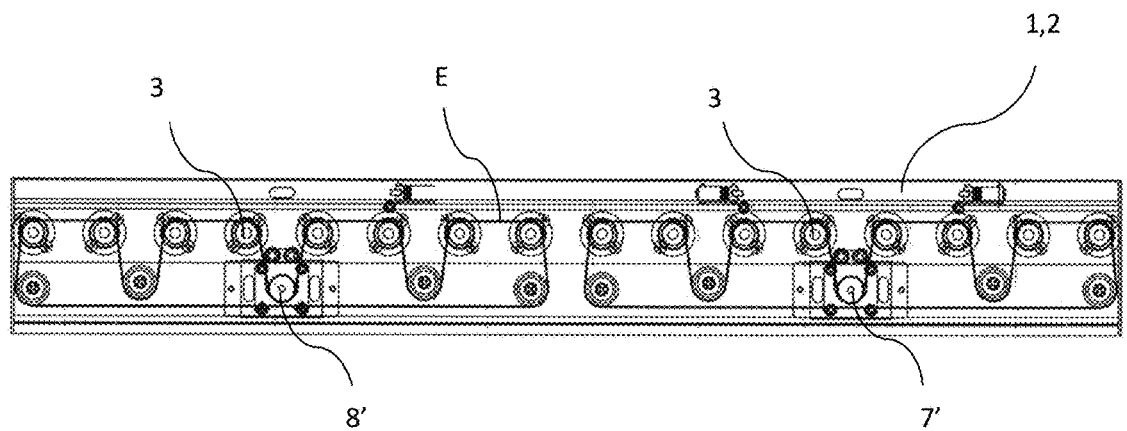
FIG. 23 is a side elevation of the roller type transportation structure body of the semiconductor wafer cassette roller type transportation structure system of the invention driven by the two activation rods in cooperation with the rollers.

As shown in FIGS. 22 to 23 specifically, the roller type transportation structure body of the semiconductor wafer cassette roller type transportation structure system of the invention driven by two activation rods 7 and 8 in cooperation with the small rollers 4 and the large rollers 3 is shown in a top view and a side elevation respectively. The activation rods 7 and 8 are provided between the left supporting frame 1 and the right supporting frame 2. The large rollers 3 are provided on an inner surface of each of the left supporting frame 1 and the right supporting frame 2. The small rollers 4 are provided under the large rollers 3. Driving wheels 7' and 8' are provided under the large rollers 3 substantially aligned with the small rollers 4. A driving belt E is used to rotate the large rollers 3 and the small rollers 4.

Figure 24:
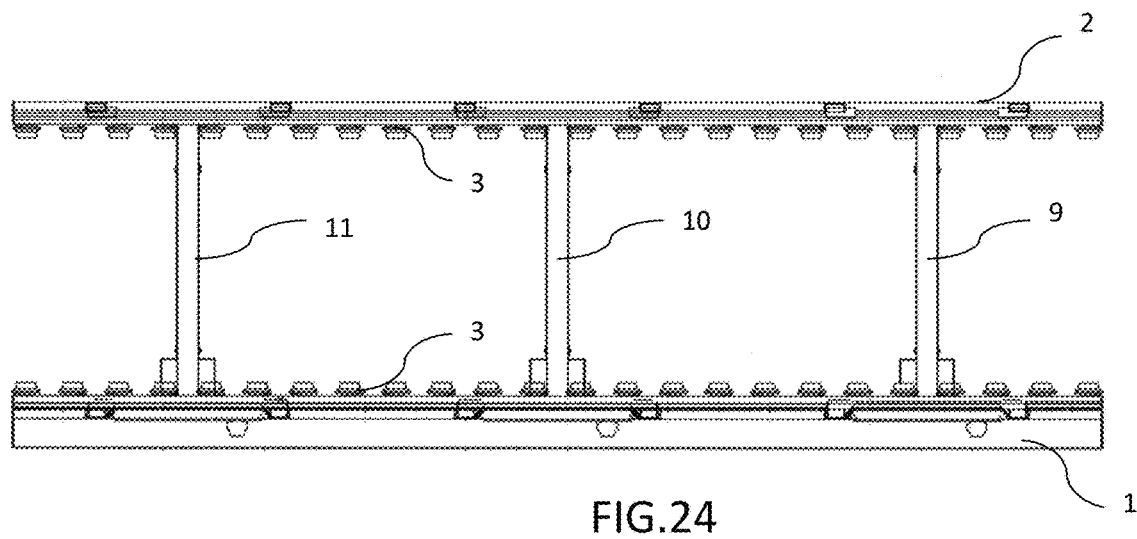
FIG. 24 is a top view of the roller type transportation structure body of the semiconductor wafer cassette roller type transportation structure system of the invention driven by three activation rods in cooperation with the rollers.
Figure 25:
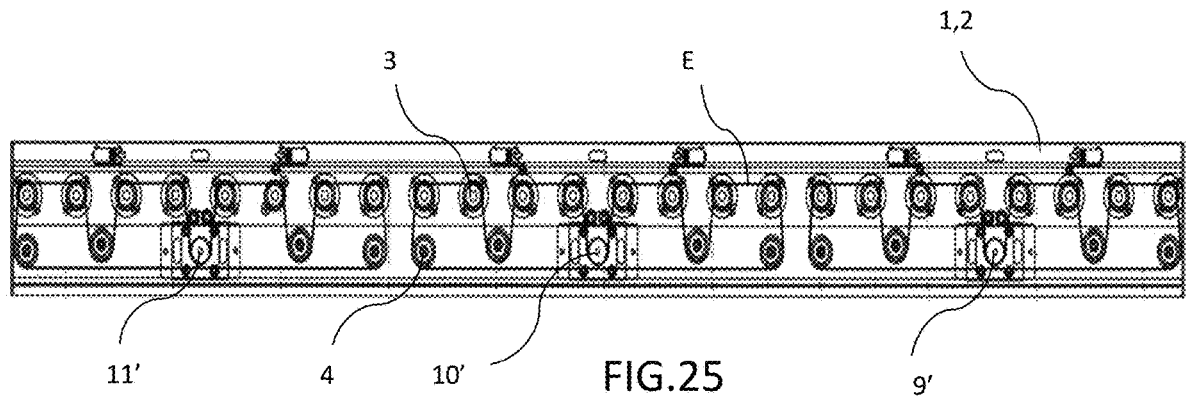
FIG. 25 is a side elevation of the roller type transportation structure body of the semiconductor wafer cassette roller type transportation structure system of the invention driven by the three activation rods in cooperation with the rollers.

As shown in FIGS. 24 to 25 specifically, the roller type transportation structure body of the semiconductor wafer cassette roller type transportation structure system of the invention driven by three activation rods 9, 10 and 11 in cooperation with the small rollers 4 and the large rollers 3 is shown in a top view and a side elevation respectively. The activation rods 9, 10 and 11 are provided between the left supporting frame 1 and the right supporting frame 2. The large rollers 3 are provided on an inner surface of each of the left supporting frame 1 and the right supporting frame 2. The small rollers 4 are provided under the large rollers 3. Driving wheels 9', 10' and 11' are provided under the large rollers 3 substantially aligned with the small rollers 4. A driving belt E is used to rotate the large rollers 3 and the small rollers 4.

Figure 26:
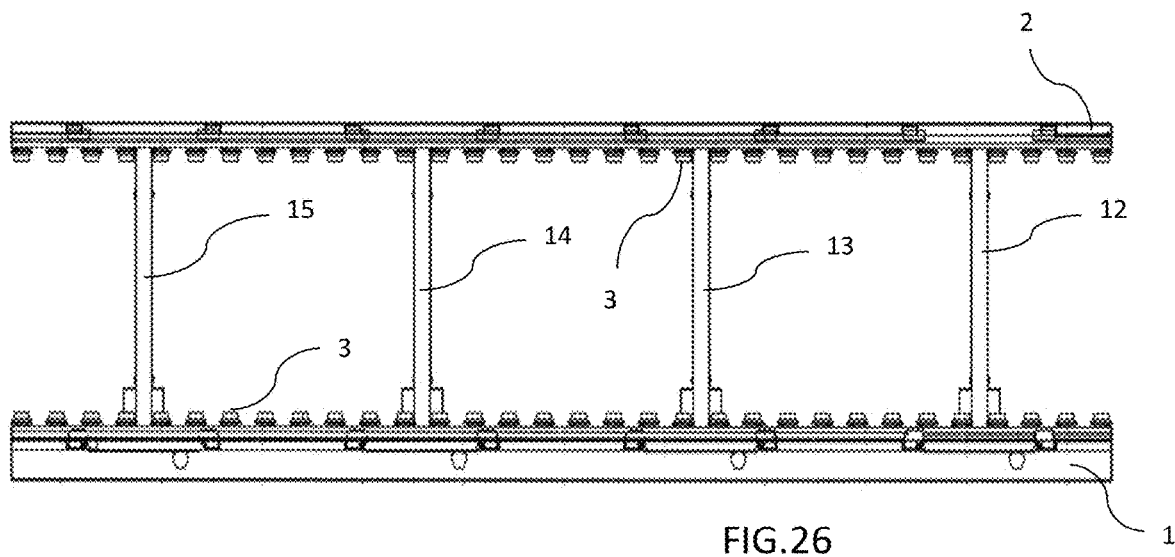
FIG. 26 is a top view of the roller type transportation structure body of the semiconductor wafer cassette roller type transportation structure system of the invention driven by four activation rods in cooperation with the rollers.
Figure 27:
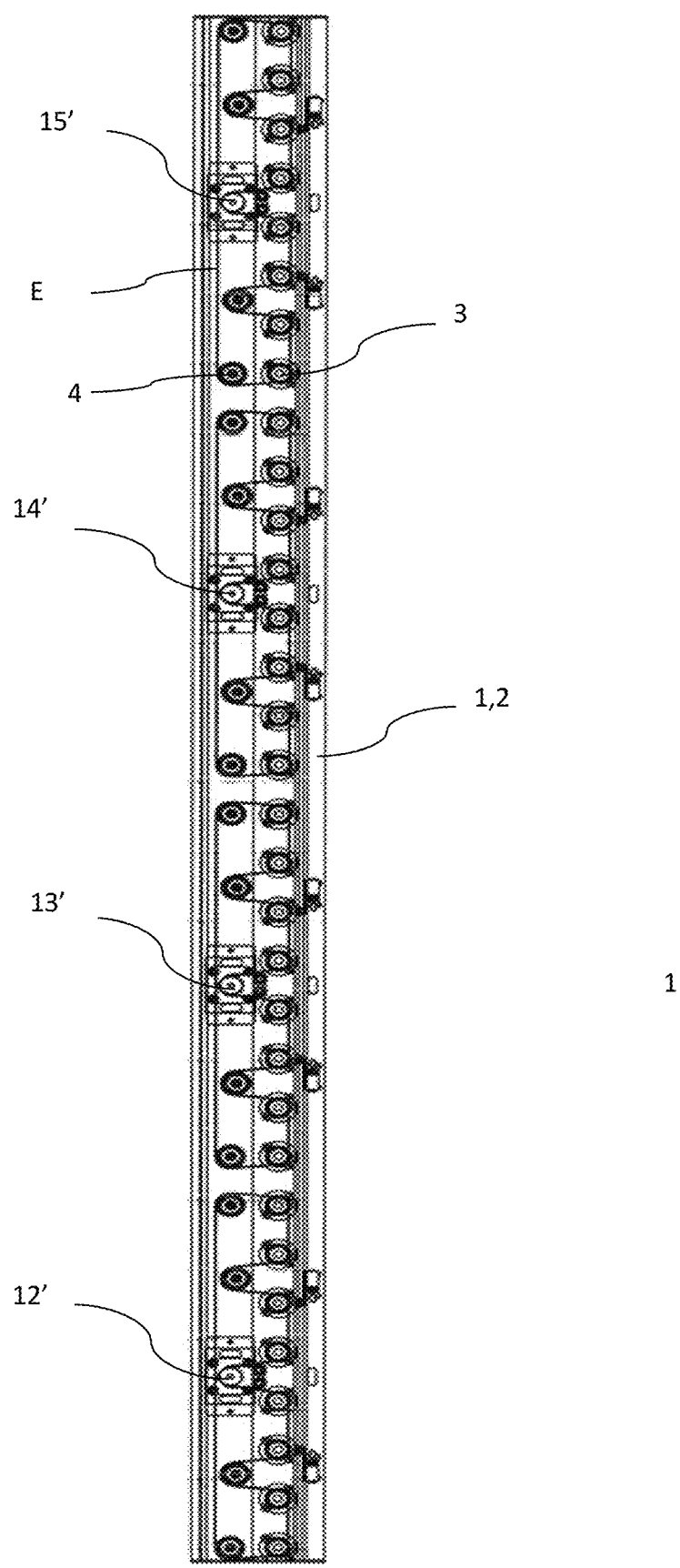
FIG. 27 is a side elevation of the roller type transportation structure body of the semiconductor wafer cassette roller type transportation structure system of the invention driven by the four activation rods in cooperation with the rollers.

As shown in FIGS. 26 to 27 specifically, the roller type transportation structure body of the semiconductor wafer cassette roller type transportation structure system of the invention driven by four activation rods 12, 13, 14 and 15 in cooperation with the small rollers 4 and the large rollers 3 is shown in a top view and a side elevation respectively. The activation rods 12, 13, 14 and 15 are provided between the left supporting frame 1 and the right supporting frame 2. The large rollers 3 are provided on an inner surface of each of the left supporting frame 1 and the right supporting frame 2. The small rollers 4 are provided under the large rollers 3. Driving wheels 12', 13', 14' and 15' are provided under the large rollers 3 substantially aligned with the small rollers 4. A driving belt E is used to rotate the large rollers 3 and the small rollers 4.

Figure 28:
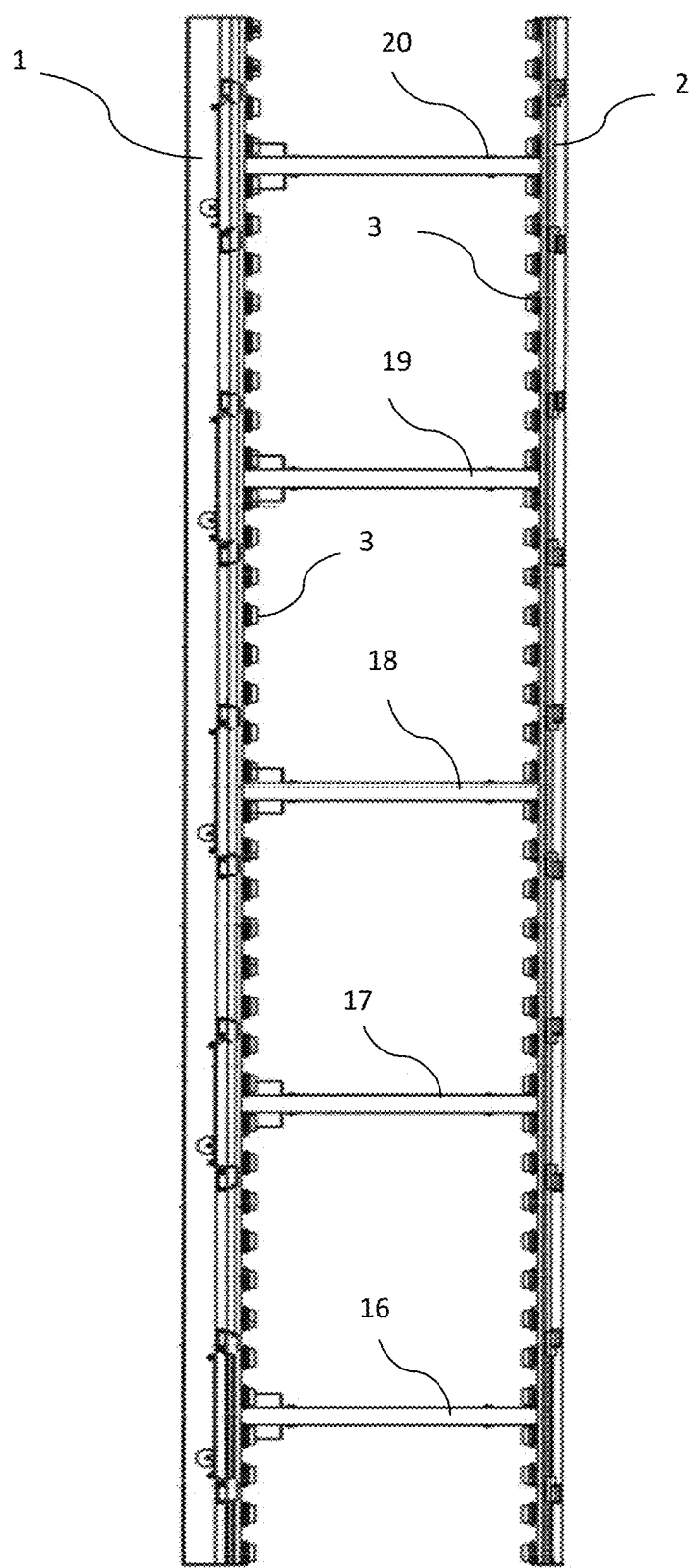
FIG. 28 is a top view of the roller type transportation structure body of the semiconductor wafer cassette roller type transportation structure system of the invention driven by five activation rods in cooperation with the rollers.
Figure 29:
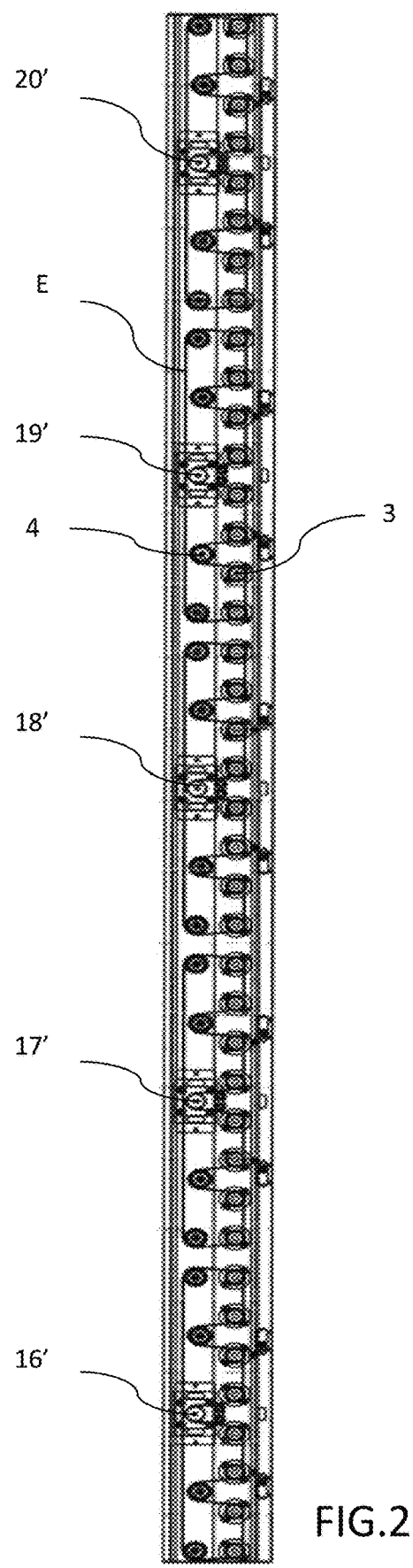
FIG. 29 is a side elevation of the roller type transportation structure body of the semiconductor wafer cassette roller type transportation structure system of the invention driven by the five activation rods in cooperation with the rollers.
Figure 30:
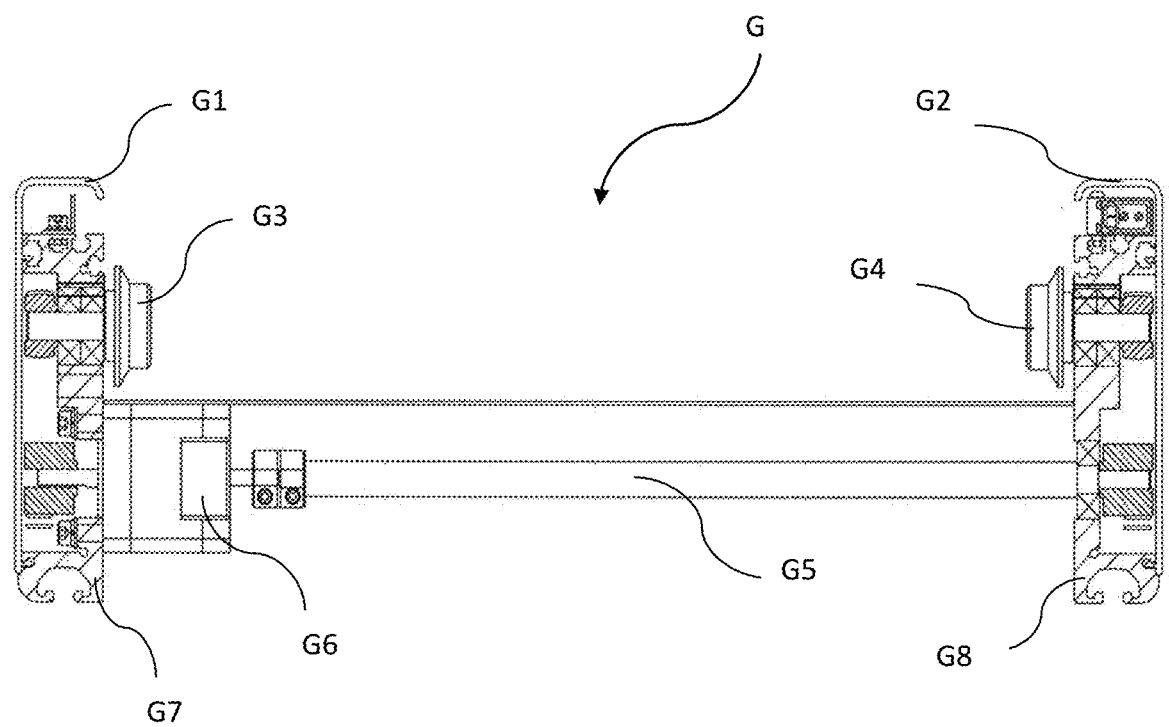
FIG. 30 is a front view of the rotating transportation structure body of the semiconductor wafer cassette roller type transportation structure system of the invention.
Figure 31:
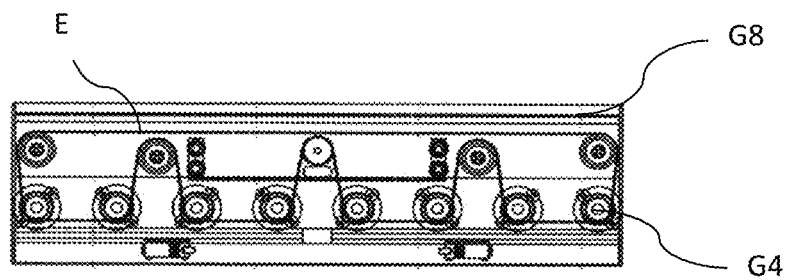
FIG. 31 is one side elevation of the rotating transportation structure body of the semiconductor wafer cassette roller type transportation structure system of the invention.
Figure 32:
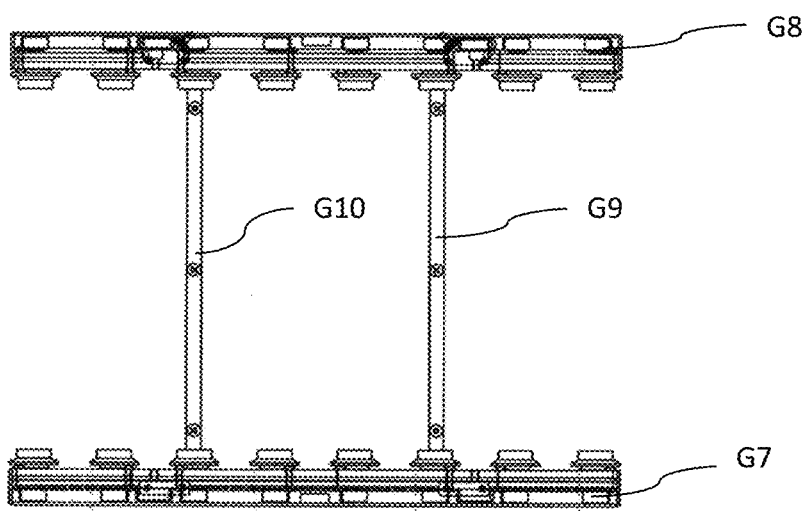
FIG. 32 is a top view of the rotating transportation structure body of the semiconductor wafer cassette roller type transportation structure system of the invention.
Figure 33:
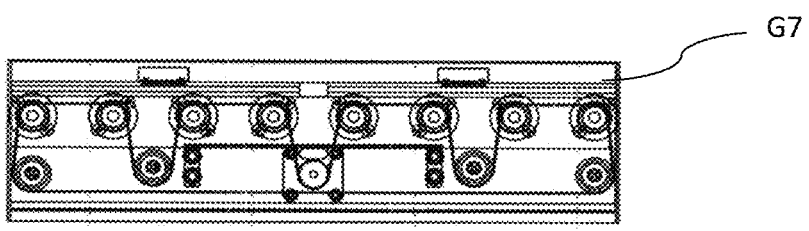
FIG. 33 is the other side elevation of the rotating transportation structure body of the semiconductor wafer cassette roller type transportation structure system of the invention.

As shown in FIGS. 28 to 29 specifically, the roller type transportation structure body of the semiconductor wafer cassette roller type transportation structure system of the invention driven by five activation rods 16, 17, 18, 19 and 20 in cooperation with the small rollers 4 and the large rollers 3 is shown in a top view and a side elevation respectively. The activation rods 16, 17, 18, 19 and 20 are provided between the left supporting frame 1 and the right supporting frame 2. The large rollers 3 are provided on an inner surface of each of the left supporting frame 1 and the right supporting frame 2. The small rollers 4 are provided under the large rollers 3. Driving wheels 16', 17', 18', 19' and 20' are provided under the large rollers 3 substantially aligned with the small rollers 4. A driving belt E is used to rotate the large rollers 3 and the small rollers 4.

As shown in FIGS. 30 to 33 specifically, the rotating transportation structure body B includes a roller transportation structure G and a rotating seat B1. The roller transportation structure G includes a first outer covering member G1 at a left side of the left supporting frame G7, a large roller G3 at an upper portion of the left supporting frame G7, a driving motor G6 at a lower portion of the left supporting frame G7, a motor shaft G5 extending out of the driving motor G6 to connect to the right supporting frame G8, a second outer covering member G2 at a right side of the right supporting frame G8, a large roller G4 at an upper portion of the right supporting frame G8, and two connecting rods G9 and G10 provided between the left supporting frame G7 and the right supporting frame G8.

Figure 34:
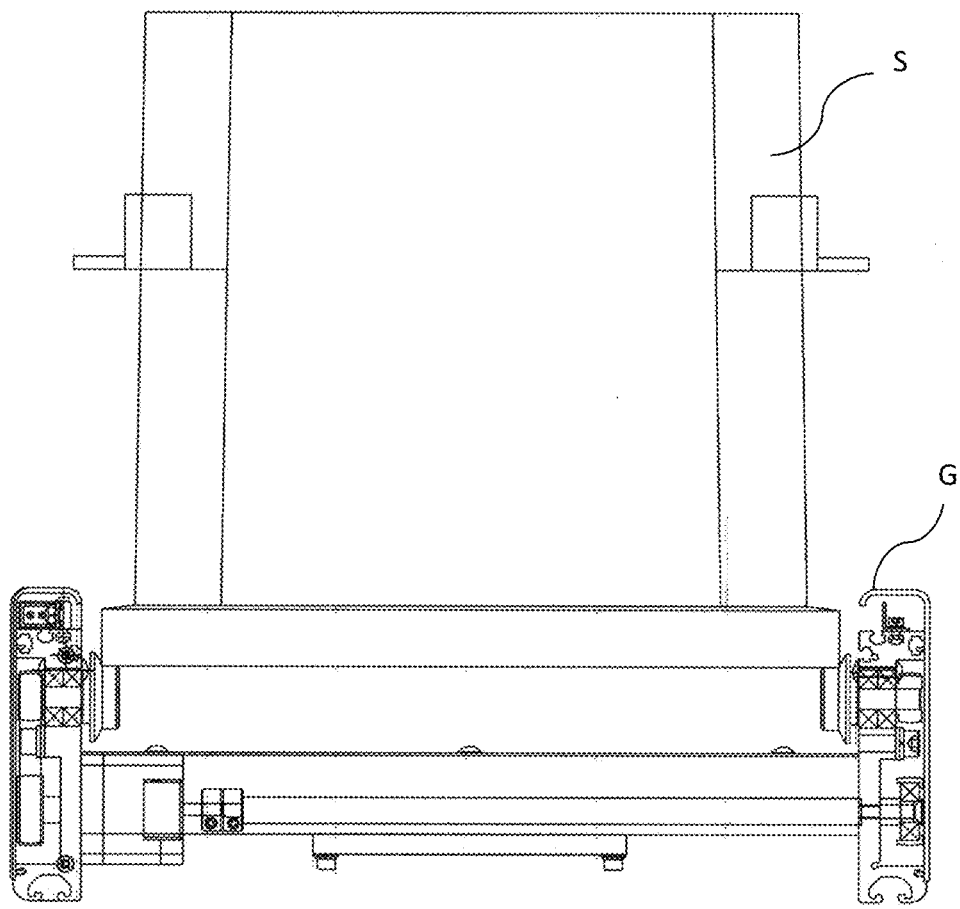
FIG. 34 schematically depicts the rotating transportation structure body of the semiconductor wafer cassette roller type transportation structure system of the invention transporting a wafer cassette in cooperation with the roller type transportation structure body.

As shown in FIG. 34 specifically, it schematically depicts the roller transportation structure G of the semiconductor wafer cassette roller type transportation structure system of the invention transporting a wafer cassette S.

Figure 35:
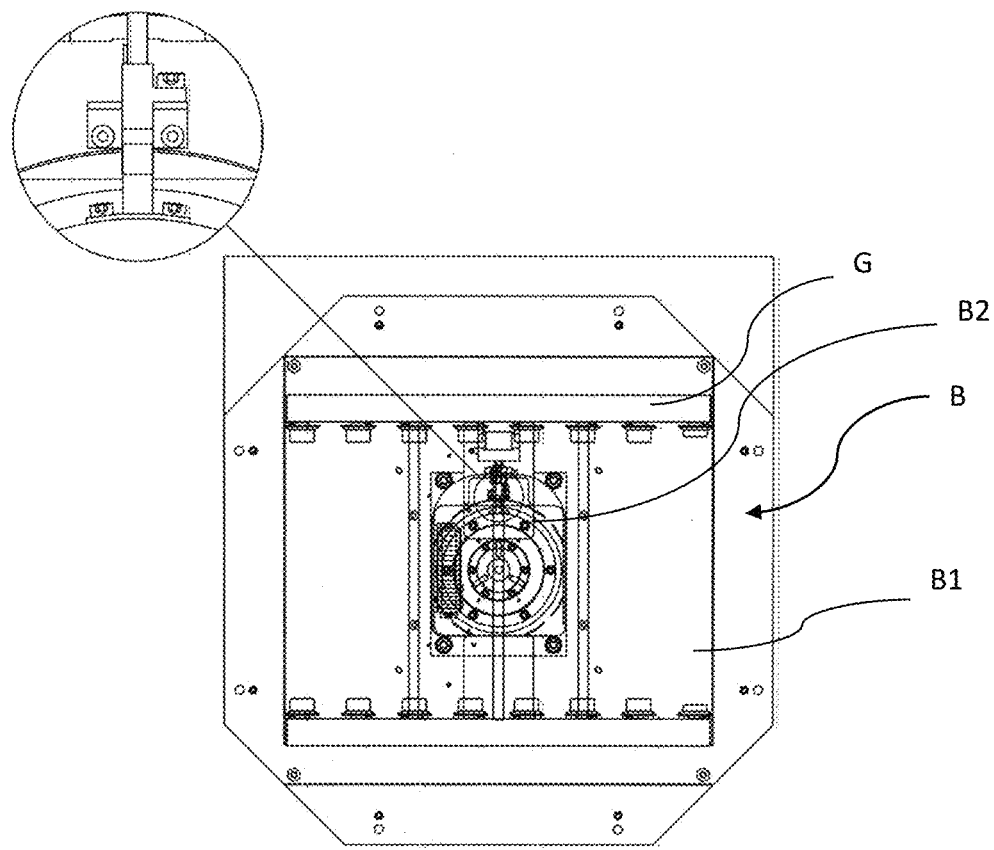
FIG. 35 is a top view of the rotating transportation structure body of the semiconductor wafer cassette roller type transportation structure system of the invention.

As shown in FIG. 35 specifically, a rotating seat B1 and a rotating motor B2 are provided under the roller transportation structure G in the rotating transportation structure body B.

Figure 36:
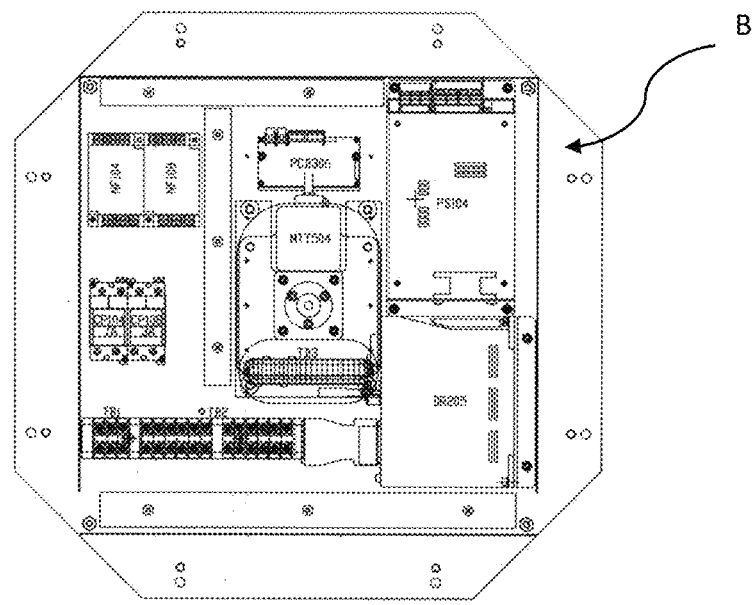
FIG. 36 is a bottom view of the rotating transportation structure body of the semiconductor wafer cassette roller type transportation structure system of the invention.

As shown in FIG. 36 specifically, it is a bottom view of the rotating transportation structure body B of the semiconductor wafer cassette roller type transportation structure system of the invention.

Figure 37:
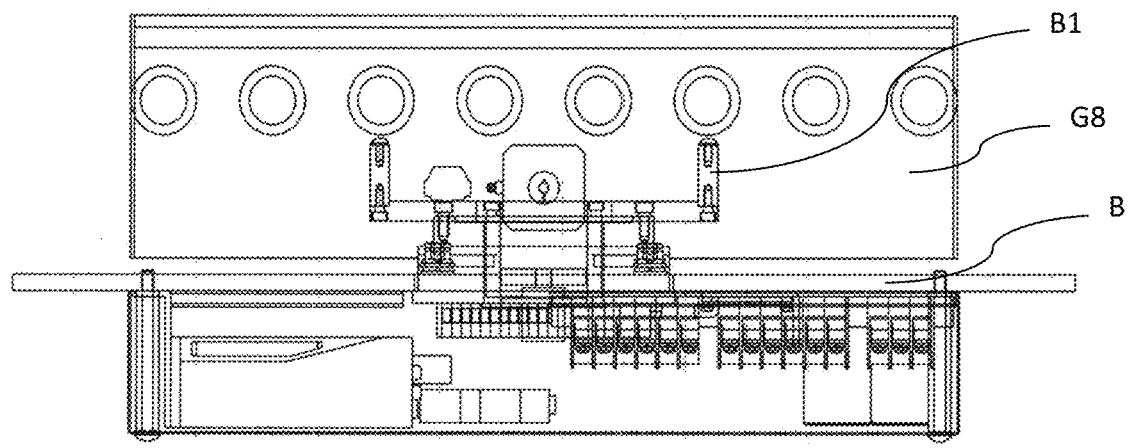
FIG. 37 is a front view in part section of the rotating transportation structure body of the semiconductor wafer cassette roller type transportation structure system of the invention.

As shown in FIG. 37 specifically, it is a front view in part section of the rotating transportation structure body B of the semiconductor wafer cassette roller type transportation structure system of the invention. The rotating seat B1 is provided on the right supporting frame G8.

Figure 38:
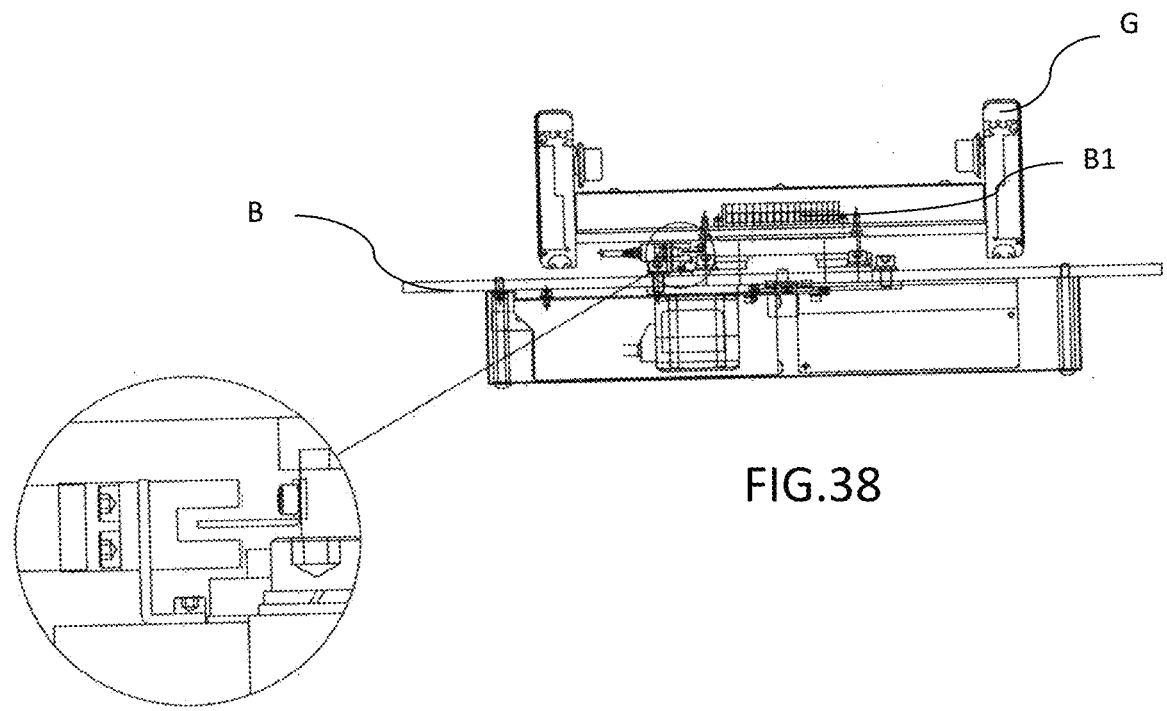
FIG. 38 a left side elevation of the rotating transportation structure body of the semiconductor wafer cassette roller type transportation structure system of the invention.

As shown in FIG. 38 specifically, it is a left side elevation of the rotating transportation structure body B of the semiconductor wafer cassette roller type transportation structure system of the invention. The rotating seat B1 is provided under the roller transportation structure G in the rotating transportation structure body B.

Figure 39:
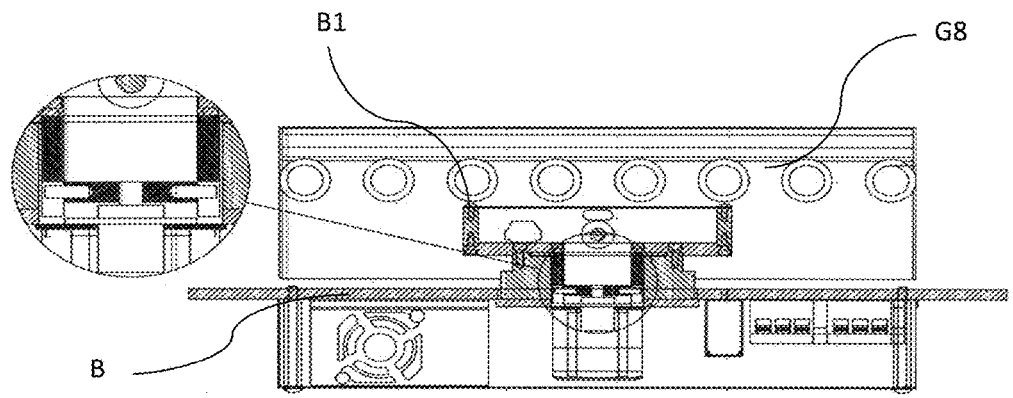
FIG. 39 is a longitudinal sectional view of the rotating transportation structure body of the semiconductor wafer cassette roller type transportation structure system of the invention shown in FIG. 37.
Figure 40:
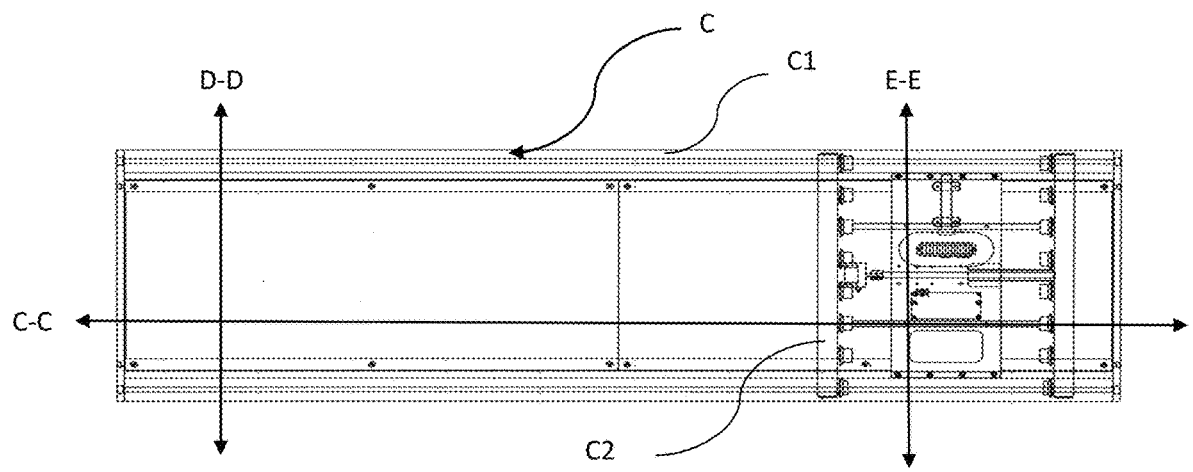
FIG. 40 is a top view of the lateral movement transportation structure body and the roller type transportation structure body of the semiconductor wafer cassette roller type transportation structure system of the invention.
Figure 41:
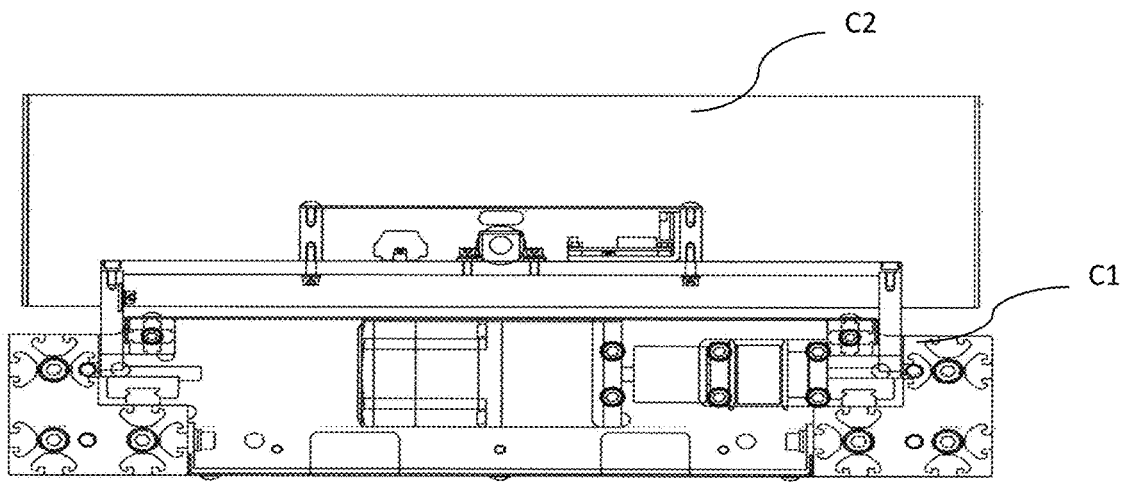
FIG. 41 is a side elevation of the lateral movement transportation structure body of the semiconductor wafer cassette roller type transportation structure system of the invention.
Figure 42:
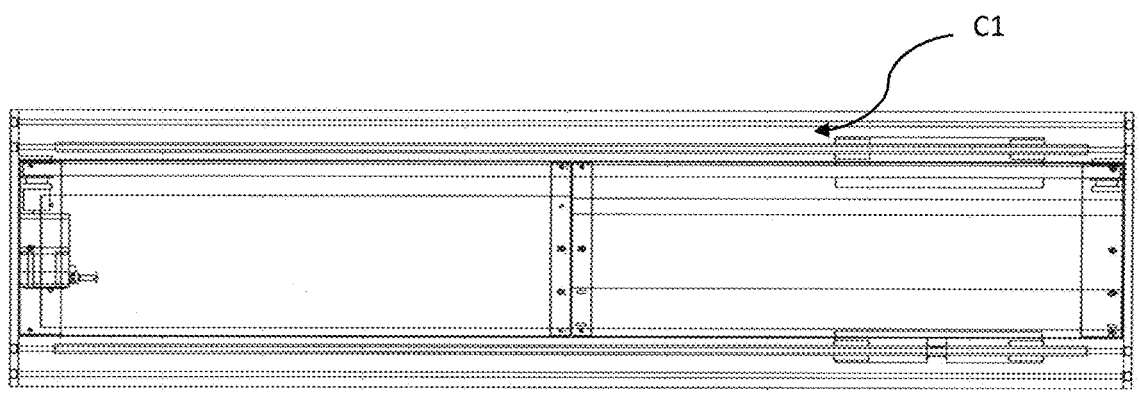
FIG. 42 schematically depicts the lateral movement transportation structure body of the semiconductor wafer cassette roller type transportation structure system of the invention joined the wafer cassette.
Figure 43:
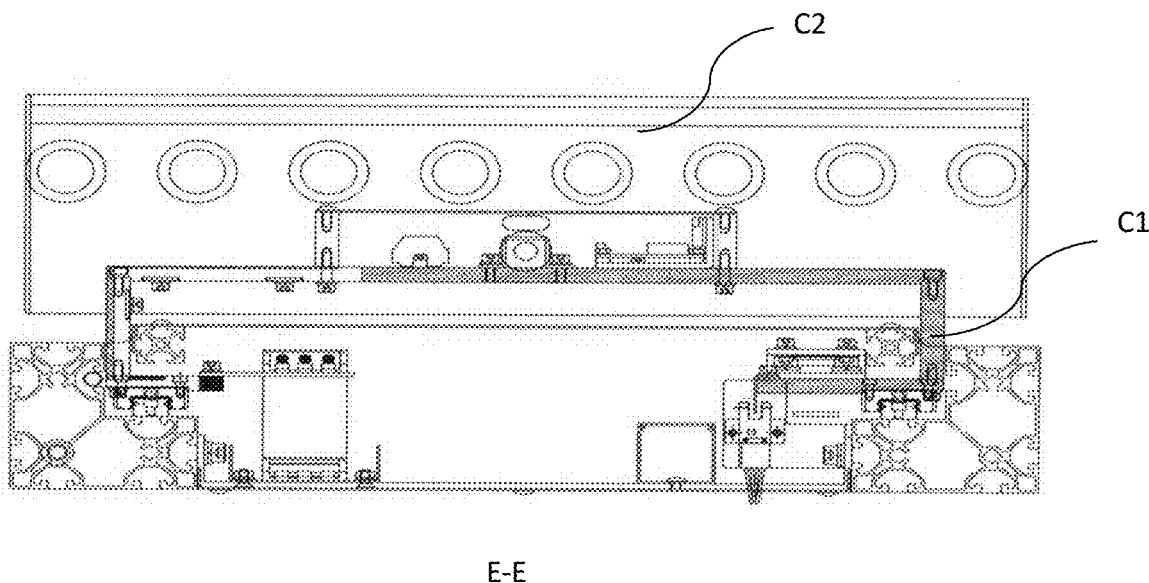
FIG. 43 is a sectional view taken along line E-E of the lateral movement transportation structure body of the semiconductor wafer cassette roller type transportation structure system of the invention shown in FIG. 40.
Figure 44:
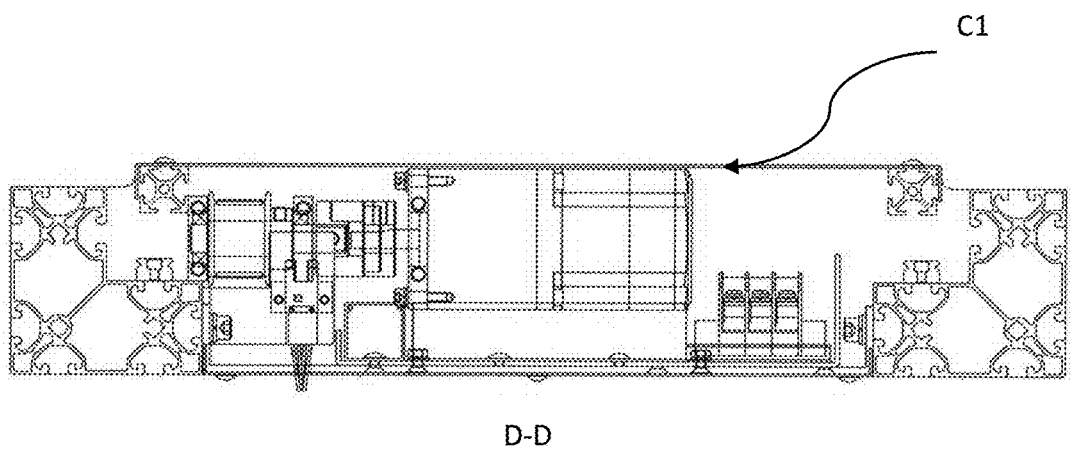
FIG. 44 is a sectional view taken along line D-D of the lateral movement transportation structure body of the semiconductor wafer cassette roller type transportation structure system of the invention shown in FIG. 40.
Figure 45:
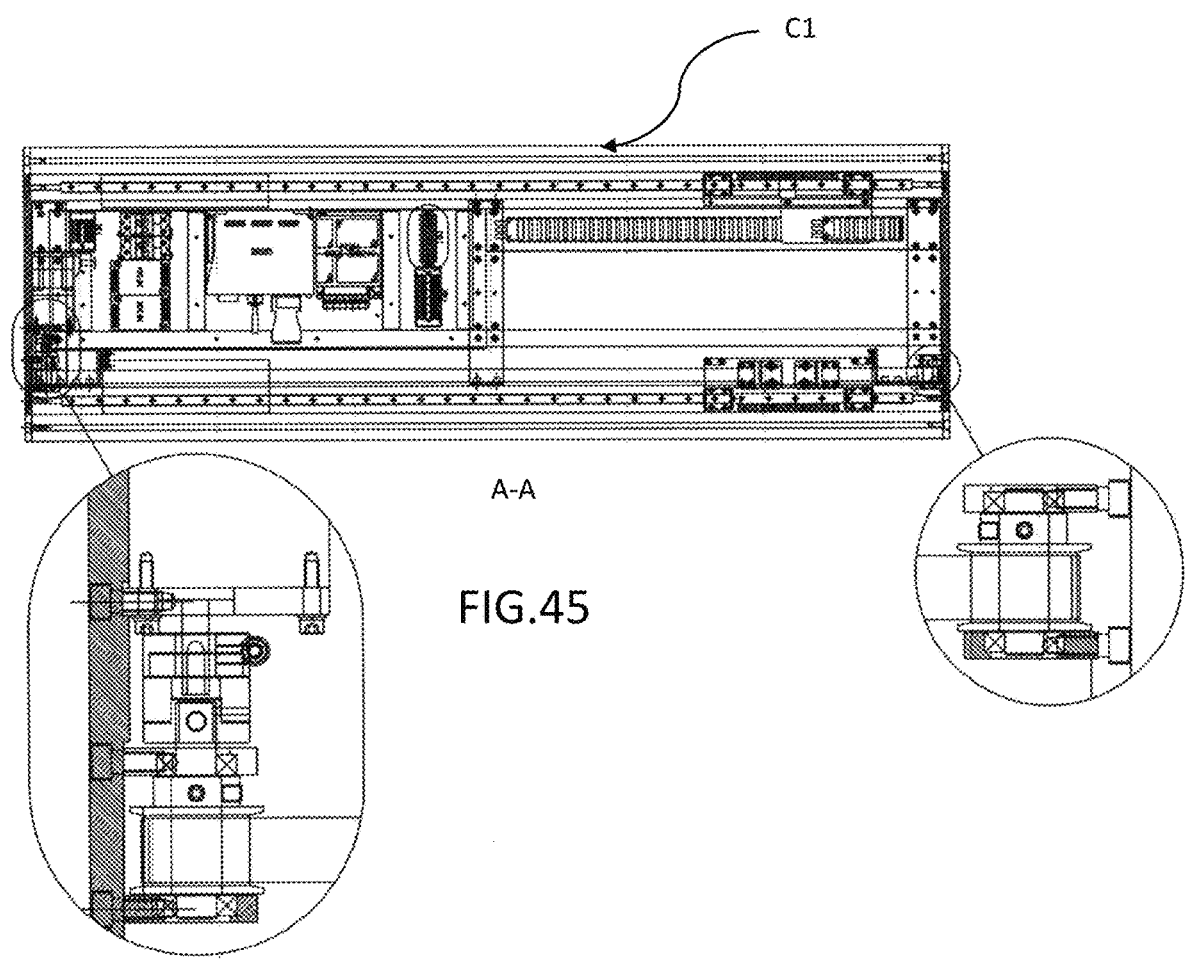
FIG. 45 is a sectional view taken along line A-A of the lateral movement transportation structure body of the semiconductor wafer cassette roller type transportation structure system of the invention shown in FIG. 40.
Figure 46:
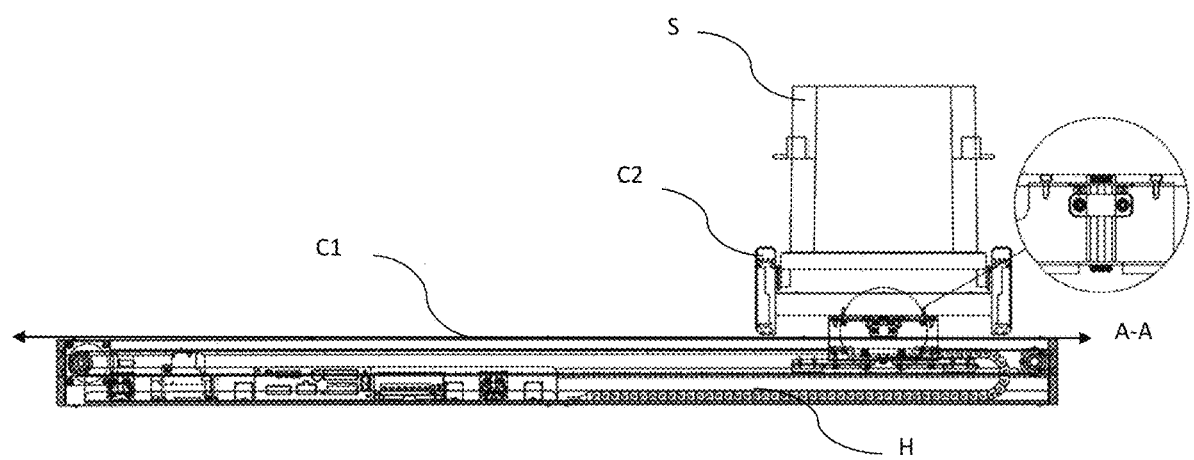
FIG. 46 is a front view in part section of the lateral movement transportation structure body of the semiconductor wafer cassette roller type transportation structure system of the invention joined the wafer cassette.

As shown in FIG. 39 specifically, it is a longitudinal sectional view of the rotating transportation structure body B of the semiconductor wafer cassette roller type transportation structure system of the invention shown in FIG. 37. The rotating seat B1 is provided on the right supporting frame G8.

As shown in FIGS. 40 to 46 specifically, the lateral movement transportation structure body C of the semiconductor wafer cassette roller type transportation structure system of the invention includes a lateral movement structure C1 and a roller transportation structure C2 in which an internal driving link H of the lateral movement structure C1 is used to laterally move the wafer cassette S in cooperation with the roller transportation structure C2.

While the invention has been described in terms of preferred embodiments, those skilled in the art will recognize that the invention can be practiced with modifications within the spirit and scope of the appended claims.

What is claimed is:
1. A semiconductor wafer cassette roller type transportation structure system, comprising a roller type transportation structure body, a rotating transportation structure body, and a lateral movement transportation structure body, wherein:
the roller type transportation structure body includes a left supporting frame, a right supporting frame, a plurality of large rollers, a plurality of small rollers, an elongated cover, an activation rod, and a driving belt;
the supporting frame is shaped as a U and includes a top U-shaped groove, a bottom U-shaped groove, an interconnection surface interconnecting the top U-shaped groove and the bottom U-shaped groove, a plurality of first apertures provided on the interconnection surface with the large rollers provided therein respectively, a plurality of second apertures provided on the interconnection surface with the small rollers provided therein respectively, and a hole provided through the interconnection surface;
a driving wheel of the activation rod passes through the hole;
each of the plurality of large rollers includes a hollow first main body, a screw inserted into the first main body, a plurality of first bearings, a first roller, and a connecting rod driven through the first bearings and the first roller to be fastened by the screw in the first main body; and
each of the plurality of small rollers includes a hollow second main body, a second bearing, a second roller, and a screw driven through the second main body and the second bearing to be fastened in the second roller;
the elongated cover includes two screw holes at either end;
the activation rod including a driving motor, a motor shaft driven by the driving motor, a bearing member put on an open end of the motor shaft; and the driving belt for rotating the large rollers, the small rollers, and the driving wheel;
wherein the roller type transportation structure body includes a roller transportation structure;
the roller transportation structure includes a first outer covering member at a left side of the left supporting frame, a portion of the plurality of large rollers at an upper portion of the left supporting frame, a driving motor at a lower portion of the left supporting frame, a motor shaft extending out of the driving motor to connect to the right supporting frame, a second outer covering member at a right side of the right supporting frame, another portion of the plurality of large rollers at an upper portion of the right supporting frame, and a plurality of connecting rods provided between the left supporting frame and the right supporting frame;
the rotating transportation structure body includes a rotating seat and a rotating motor both provided under the roller transportation structure;
the lateral movement transportation structure body includes a lateral movement structure, a roller transportation structure, and a driving link in the lateral movement structure for laterally moving the wafer cassette in cooperation with the roller transportation structure; and
in response to the roller type transportation structure body transporting the wafer cassette, the rotating transportation structure body rotates to change a movement direction of the wafer cassette, and the lateral movement transportation structure body transports the wafer cassette along a lateral movement direction.

2. The semiconductor wafer cassette roller type transportation structure system of claim 1, wherein the cover is provided above the activation rod interconnecting the left supporting frame and the right supporting frame.

3. The semiconductor wafer cassette roller type transportation structure system of claim 2, further comprising a plurality of activation rods provided between the left supporting frame and the right supporting frame wherein the large rollers are provided on an inner surface of each of the left supporting frame and the right supporting frame, the small rollers are provided under the large rollers, the driving wheels are provided under the large rollers substantially aligned with the small rollers, and the driving belt is configured to rotate the large rollers and the small rollers.

4. The semiconductor wafer cassette roller type transportation structure system of claim 1, further comprising a plurality of activation rods provided between the left supporting frame and the right supporting frame wherein the large rollers are provided on an inner surface of each of the left supporting frame and the right supporting frame, the small rollers are provided under the large rollers, the driving wheels are provided under the large rollers substantially aligned with the small rollers, and the driving belt is configured to rotate the large rollers and the small rollers.

* * * * *